(12) United States Patent
Takakuwa

(10) Patent No.: US 9,631,068 B2
(45) Date of Patent: Apr. 25, 2017

(54) PHOTO-CURABLE RESIN COMPOSITION AND METHOD FOR FORMING A FINE PATTERN USING THE SAME

(71) Applicant: SAMSUNG DISPLAY CO., LTD., Yongin-si, Gyeonggi-Do (KR)

(72) Inventor: Atsushi Takakuwa, Hwaseong-Si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/960,796

(22) Filed: Dec. 7, 2015

(65) Prior Publication Data
US 2016/0272791 A1    Sep. 22, 2016

(30) Foreign Application Priority Data

Mar. 18, 2015 (KR) .................. 10-2015-0037469

(51) Int. Cl.
| | |
|---|---|
| *B44C 1/22* | (2006.01) |
| *C08K 9/04* | (2006.01) |
| *C09B 67/46* | (2006.01) |
| *G03F 7/00* | (2006.01) |
| *G03F 7/004* | (2006.01) |
| *G03F 7/027* | (2006.01) |
| *G03F 7/029* | (2006.01) |
| *G03F 7/031* | (2006.01) |
| *C08K 9/02* | (2006.01) |
| *C23F 4/00* | (2006.01) |

(52) U.S. Cl.
CPC ............ *C08K 9/04* (2013.01); *C09B 67/0089* (2013.01); *G03F 7/0002* (2013.01); *G03F 7/0047* (2013.01); *G03F 7/027* (2013.01); *G03F 7/029* (2013.01); *G03F 7/031* (2013.01); *C08K 9/02* (2013.01); *C08K 2201/011* (2013.01); *C23F 4/00* (2013.01)

(58) Field of Classification Search
CPC ..... C09B 67/0089; C09B 67/009; C08K 9/04; C08K 9/10
USPC ............ 216/41, 48, 49; 430/270.1, 302, 304
See application file for complete search history.

(56) References Cited

U.S. PATENT DOCUMENTS

| | | | | |
|---|---|---|---|---|
| 8,258,225 | B2 * | 9/2012 | Barkac .................. | C09D 5/033 428/323 |
| 8,908,293 | B2 * | 12/2014 | Maruyama .......... | B01F 17/0007 359/722 |
| 2005/0084613 | A1 * | 4/2005 | wang .................... | B82Y 10/00 427/282 |
| 2010/0291474 | A1 * | 11/2010 | Baran, Jr. .............. | B82Y 30/00 430/2 |
| 2015/0009432 | A1 * | 1/2015 | Katagiri ................. | G06F 3/041 349/12 |

FOREIGN PATENT DOCUMENTS

| | | |
|---|---|---|
| JP | 2004271558 | 9/2004 |
| JP | 2005316495 | 11/2005 |
| KR | 1020090072404 | 7/2009 |

(Continued)

*Primary Examiner* — Lan Vinh
(74) *Attorney, Agent, or Firm* — F. Chau & Associates, LLC

(57) ABSTRACT

A photo-curable resin composition includes a nano-particle. The nano-particle is surface-modified with an organic compound. The photo-curable resin composition includes a photo-polymerization initiator and a radical-reactive monomer.

17 Claims, 3 Drawing Sheets

(56) References Cited

FOREIGN PATENT DOCUMENTS

| | | |
|---|---|---|
| KR | 1020120039589 | 4/2012 |
| KR | 1020140080542 | 6/2014 |
| KR | 1020160072379 | 6/2016 |

\* cited by examiner

PHOTO-CURABLE RESIN COMPOSITION AND METHOD FOR FORMING A FINE PATTERN USING THE SAME

CROSS-REFERENCE TO RELATED APPLICATION

This application claims priority under 35 U.S.C. §119 to Korean Patent Application No. 10-2015-0037469, filed on Mar. 18, 2015 in the Korean Intellectual Property Office, the disclosure of which is incorporated by reference herein in its entirety.

TECHNICAL FIELD

Exemplary embodiments of the present inventive concept relate to a photo-curable resin composition. More particularly, the exemplary embodiments of the present inventive concept relate to a method for forming a fine pattern using the photo-curable resin composition.

DISCUSSION OF THE RELATED ART

Generally, a liquid crystal display device applies a voltage to a liquid crystal layer to change alignment of liquid crystal molecules. When alignment of liquid crystal molecules is changed, optical properties such as a birefringence, an optical activity, a dichroism, or a light scattering may cause visible changes to display an image.

A liquid crystal display device generally includes a polarizer for controlling a transmittance of light. Examples of the polarizer may include an absorbing polarizer and a reflective polarizer. The reflective polarizer may reflect a specific polarizing component for polarization. The reflective polarizing component may be reused by a reflective plate of a backlight assembly to increase a brightness of a display device. The reflective polarizer may be formed as a wire grid polarizer that is directly formed with a display panel to form an in-cell structure.

The wire grid polarizer may include a linear metal pattern. According to a method for forming the linear metal pattern, after a mask is formed on a metal layer through nano-imprinting, for example, the metal layer may be etched. The mask may be formed from a photo-curable resin composition.

SUMMARY

According to an exemplary embodiment of the present inventive concept, a photo-curable resin composition includes a nano-particle. The nano-particle is surface-modified with an organic compound. The photo-curable resin composition includes a photo-polymerization initiator and a radical-reactive monomer.

In an exemplary embodiment of the present inventive concept, the photo-curable resin composition may include from about 0.01% to about 10% by weight of the nano-particle, from about 0.01% to about 10% by weight of the photo-polymerization initiator and a remainder of the photo-curable resin composition may include the radical-reactive monomer.

In an exemplary embodiment of the present inventive concept, the nano-particle may include a particle core including at least one selected from the group consisting of a carbon, a silicon oxide, a metal, a metal oxide and a fluorescent semiconductor.

In an exemplary embodiment of the present inventive concept, the metal may include at least one selected from the group consisting of gold, silver and aluminum.

In an exemplary embodiment of the present inventive concept, the metal oxide may include at least one selected from the group consisting of aluminum oxide ($Al_2O_3$), copper oxide (CuO) and titanium oxide ($TiO_2$).

In an exemplary embodiment of the present inventive concept, the fluorescent semiconductor may include at least one selected from the group consisting of cadmium selenide (CdSe), cadmium telluride (CdTe), zinc sulfide (ZnS), zinc selenide (ZnSe), cadmium sulfide (CdS), lead selenide (PbSe) and lead sulfide (PbS).

In an exemplary embodiment of the present inventive concept, a diameter of the nano-particle may be equal to or less than about 10 nm.

In an exemplary embodiment of the present inventive concept, the organic compound may include at least one selected from the group consisting of an acryloyl group, a methacryloyl group and an epoxy group.

In an exemplary embodiment of the present inventive concept, the organic compound may include an acryloyl group.

In an exemplary embodiment of the present inventive concept, the photo-polymerization initiator may include at least one selected from the group consisting of -phenoxy-dichloro acetophenone, 4-t-butyl-dichloro acetophenone, 4-t-butyl-trichloro acetophenone, diethoxy acetophenone, 2-hydroxy-2-cyclohexyl acetophenone, 2-hydroxy-2-phenyl-1-phenyl propane-1-one, 1-(4-dodecylphenyl)-2-hydroxy-2-methyl propane-1-one, 1-(4-isopropylphenyl)-2-hydroxy-2-methyl propane-1-one, 4-(2-hydroxyethoxy)-phenyl-(2-hydroxy-2-propyl)ketone, 1-hydroxy-cyclohexylphenylketone, benzoin, benzoin methylethyl, benzoin isopropylethyl, benzoin isobutylethyl, bezophenone, benzoyl benzoic acid, benzoyl benzoic acid methyl, 4-phenylbenzophenone, hydroxyl benzophenone, acrylated benzophenone, 4-benzoyl-4'methyldiphenyldisulfide, 3,3'-dimethyl-4-methoxy benzophenone, 4,4'-dimethylamino benzophenone, 4,4'-diethylaminobenzophenone, 3,3',4,4'-tetra(t-butylperoxicarbonyl)benzophenone, thioxanthone, 2-chloro thioxanthone, 2-methyl thioxanthone, 2,4-dimethyl thioxanthone, 2,3-diethyl thioxanthone, 2,4-diisopropyl thioxanthone, isopropyl thioxanthone, 1-chloro-4-propyl thioxanthone, α-acyloxime ester, methylphenyl glyoxylate, 9,10-phenanthrenequinone, camphorquinone, dibenzosuberone, 2-ethylanthraquinone, 4',4"-diethylisophthalphenone, 2,2'-bis(2-chlorophenyl)-4,4',5,6'-tetraphenyl-1,2'-imidazole, 2,4,6-trimethylbenzoyldiphenyl phophine oxide, triphenylphosphonium hexafluoroantimonate, triphenylphosphonium hexafluorophosphate, 4-chlorophenyldiphenylsulfonium hexafluorophosphate and (2,4-cyclopentadiene-1-yl)[(1-methylethyDbenzene]-iron-hexafluorophosphate.

In an exemplary embodiment of the present inventive concept, the radical-reactive monomer may include at least one selected from the group consisting of acrylamide, (meth)acryloyl morpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethyleneglycol (meth)acrylate, t-octyl (meth)acrylamide, diacetone (meth)acrylamide, dimethylaminoethyl (meth)acrylate, ethylene glycol di(meth)acrylate, dicyclopentenyl (meth)acrylate, triethyleneglycol diacrylate, tetraethyleneglycol di(meth)acrylate and tricyclodecane diyldimethylene di(meth)acrylate.

According to an exemplary embodiment of the present inventive concept, a method for forming a fine pattern is provided. According to the method, a metal layer is formed on a base substrate. A photo-curable resin composition is deposited on the metal layer to form a coating layer. The photo-curable resin composition includes a nano-particle surface-modified with an organic compound, a photo-polymerization initiator and a radical-reactive monomer. The coating layer is patterned to form a mask pattern partially covering the metal layer. The metal layer is etched by using the mask pattern as an etch-stop layer.

In an exemplary embodiment of the present inventive concept, the metal layer may include at least one selected from the group consisting of aluminum, gold, silver, copper, chrome, iron, nickel, titanium, molybdenum, tungsten and an alloy thereof.

In an exemplary embodiment of the present inventive concept, a protective layer including silicon oxide, silicon nitride or silicon oxycarbide may be formed on the metal layer. The coating layer may be formed on the protective layer.

In an exemplary embodiment of the present inventive concept, the coating layer may be pressed with a mold. A light may be provided to the coating layer to cure the coating layer. The mold may be removed. The cured coating layer may be etched to form the mask pattern.

In an exemplary embodiment of the present inventive concept, the metal layer may be etched through a dry-etching process using plasma.

In an exemplary embodiment of the present inventive concept, a reflection intensity distribution of the mask pattern may be measured to detect a defect of the mask pattern, and the nano-particle may include a fluorescent semiconductor.

According to exemplary embodiments of the present inventive concept, a photo-curable resin composition including a nano-particle surface-modified with an organic compound may form a mask pattern having increased etch-resistance. Thus, when a layer under the mask pattern is etched, a profile of the mask pattern may be maintained. Thus, profile consistency of a pattern formed from the layer may be increased.

A nano-particle surface-modified with an organic compound and including a fluorescent semiconductor may be used for detecting defects of a mask pattern and may increase etch-resistance of the mask pattern.

BRIEF DESCRIPTION OF THE DRAWINGS

The above and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
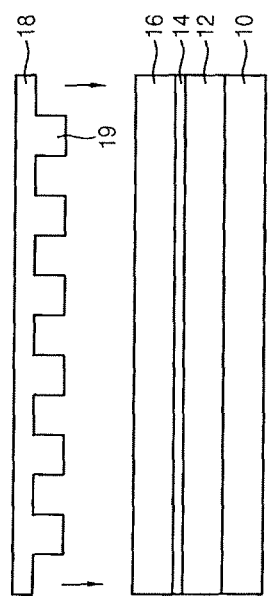
FIGS. 1 to 6 are cross-sectional views illustrating a method for forming a fine pattern according to an exemplary embodiment of the present inventive concept.

A photo-curable resin composition, and a method for forming a fine pattern using the photo-curable resin composition according to exemplary embodiments of the present inventive concept will be described below in more detail with reference to the accompanying drawings.

Photo-Curable Resin Composition

A photo-curable resin composition according to an exemplary embodiment of the present invention may include a radical reactive monomer, a nano-particle surface-modified with an organic compound and a photo-polymerization initiator. The photo-curable resin composition may include an additive such as a polymerization inhibitor, an antifoaming agent, or a releasing agent.

For example, the photo-curable resin composition may include from about 0.01% to about 10% by weight of the nano-particle surface-modified with the organic compound, from about 0.01% to about 10% by weight of the photo-polymerization initiator, and a remainder of the radical reactive monomer. The photo-curable resin composition may include from about 0.01% to about 10% by weight of the additive.

The radical reactive monomer may include at least one (meth)acryl group. Examples of the radical reactive monomer may include acrylamide, (meth)acryloyl morpholine, 7-amino-3,7-dimethyloctyl(meth)acrylate, isobutoxymethyl (meth)acrylamide, isobornyloxyethyl(meth)acrylate, isobornyl(meth)acrylate, 2-ethylhexyl(meth)acrylate, ethyldiethyleneglycol(meth)acrylate, t-octyl(meth)acrylamide, diacetone(meth)acrylamide, dimethylaminoethyl(meth)acrylate, ethylene glycol di(meth)acrylate, dicyclopentenyl (meth)acrylate, triethyleneglycol diacrylate, tetraethyleneglycol di(meth)acrylate, and tricyclodecane diyldimethylene di(meth)acrylate. The radical reactive monomer may include any of the above groups alone or may include a combination of two or more of any of the above groups, as desired.

The radical reactive monomer may generate a radical by the photo-polymerization initiator, and may form a binder resin through a chain reaction.

The radical reactive monomer may disperse the nano-particle in the photo-curable resin composition. For example, an amount of the radical reactive monomer may be from about 50% to about 95% by weight, and may be from about 80% to about 95% by weight. In another exemplary embodiment of the present inventive concept, the photo-curable resin composition may include a solvent. The solvent may adjust viscosity and/or reactivity of the photo-curable resin composition.

The nano-particle surface-modified with the organic compound may include a particle core. The organic compound may be combined with a surface of the particle core. The particle core may include a carbon, a silicon oxide, a metal or a metal oxide. For example, the nano-particle may include aluminum oxide ($Al_2O_3$), titanium oxide ($TiO_2$), or copper oxide (CuO). The particle core may include any of the carbon, silicon oxides, metals or metal oxides alone or may include a combination of two or more of the carbon, silicon oxides, metals or metal oxides, as desired. The nano-particle including the carbon, metals or metal oxides may increase etch-resistance of a mask including the photo-curable resin composition.

The particle core may include a fluorescent semiconductor. For example, the particle core may include cadmium selenide (CdSe), cadmium telluride (CdTe), zinc sulfide (ZnS), zinc selenide (ZnSe), cadmium sulfide (CdS), lead selenide (PbSe), or lead sulfide (PbS). The particle core may include any of the fluorescent semiconductors alone or may include a combination of two or more of the semiconductors, as desired. The nano-particle including the fluorescent semiconductor may be excited by light to emit light having a different wavelength. Thus, a mask including the photo-curable resin composition may be optically examined to detect a defect.

When the nano-particle is surface-modified with the organic compound, dispersion and stability of the nano-particle may be increased. A degree of cross-linking of the mask including the photo-curable resin composition may be increased. Thus, etch-resistance of the mask may be increased.

The organic compound combined with the nano-particle may include a double bond. For example, the nano-particle may include an acryloyl group ($H_2C=CH-C(=O)-$) combined with a surface thereof. When the nano-particle includes a metal, an oxide layer may be formed on a surface of the nano-particle. A carbon atom of the acryloyl group may be chemically bonded to an oxygen atom of the oxide layer. Thus, the surface of the nano-particle may be surface-modified as follows:

<Nano-Particle Surface-Modified with Acryloyl Group>

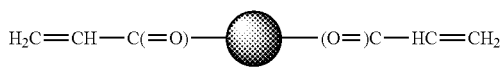

The acryloyl group may be cured. The acryloyl group may be cured relatively rapidly. The acryloyl group may increase degree of freedom for designing a resin. The acryloyl group may be cured at a relatively low temperature.

In another exemplary embodiment of the present inventive concept, the organic compound may include methacryloyl group or an epoxy group.

A diameter of the nano-particle may be equal to or less than about 10 nm. When a diameter of the nano-particle is more than 10 nm, dispersion of the nano-particle may be reduced, and it may be more difficult to form a fine pattern. For example, the diameter of the nano-particle may be from about 1nm to about 10 nm.

When an amount of the nano-particle surface-modified with an organic compound is less than about 0.01% by weight based on a total weight of the photo-curable resin composition, etch-resistance may be slightly increased. When the amount of the nano-particle surface-modified with the organic compound is more than about 10% by weight, dispersion of the nano-particle may be reduced. Thus, the amount of the nano-particle surface-modified with the organic compound may be from about 0.01% to about 10% by weight based on the total weight of the photo-curable resin composition, and may be from about 1% to about 10% by weight based on the total weight of the photo-curable resin composition.

The photo-polymerization initiator may include an acetophenone-based compound, a benzoin-based compound, a benzophenone-based compound, a thioxanthone-based compound, a ketone-based compound, an imidazole-based compound, an acylphosphine oxide-based compound, or an onium salt-based compound.

For example, the acetophenone-based compound may include 4-phenoxydichloro acetophenone, 4-t-butyl-dichloro acetophenone, 4-t-butyl-trichloro acetophenone, diethoxy acetophenone, 2-hydroxy-2-cyclohexyl acetophenone, 2-hydroxy-2-phenyl-1-phenyl propane-1-one, 1-(4-dodecylphenyl)-2-hydroxy-2-methyl propane-1-one, 1-(4-isopropylphenyl)-2-hydroxy-2-methyl propane-1-one, 4-(2-hydroxyethoxy)-phenyl-(2-hydroxy-2-propyl)ketone, or 1-hydroxy-cyclohexylphenylketone.

For example, the benzoin-based compound may include benzoin, benzoin methylethyl, benzoin isopropylethyl, or benzoin isobutylethyl.

For example, the benzophenone-based compound may include bezophenone, benzoyl benzoic acid, benzoyl benzoic acid methyl, 4-phenylbenzophenone, hydroxyl benzophenone, acrylated benzophenone, 4-benzoyl-4'methyldiphenyldisulfide, 3,3'-dimethyl-4-methoxy benzophenone, 4,4'-dimethylamino benzophenone, 4,4'-diethylaminobenzophenone, or 3,3',4,4'-tetra(t-butylperoxicarbonyl)benzophenone.

For example, the thioxanthone-based compound may include thioxanthone, 2-chloro thioxanthone, 2-methyl thioxanthone, 2,4-dimethyl thioxanthone, 2,3-diethyl thioxanthone, 2,4-diisopropyl thioxanthone, isopropyl thioxanthone, or 1-chloro-4-propyl thioxanthone.

For example, the ketone-based compound may include α-acyloxime ester, methylphenyl glyoxylate, 9,10-phenanthrenequinone, camphorquinone, dibenzosuberone, 2-ethylanthraquinone, or 4',4''-diethylisophthalphenone.

For example, the imidazole-based compound may include 2,2'-bis(2-chlorophenyl)-4,4',5 ,6'-tetraphenyl-1,2'-imidazole.

For example, the acylphosphine oxide-based compound may include 2,4,6-trimethylbenzoyldiphenyl phophine oxide.

For example, the onium salt-based compound may include triphenylphosphonium hexafluoroantimonate, triphenylphosphonium hexafluorophosphate, 4-chlorophenyldiphenylsulfonium hexafluorophosphate, or (2,4-cyclopentadiene-1-yl) [(1-methylethyl)benzene]-iron-hexafluorophosphate.

When the amount of the photo-polymerization initiator is less than about 0.01% by weight based on the total weight of the photo-curable resin composition, curing speed may be reduced. When the amount of the photo-polymerization initiator is more than about 10% by weight based on the total weight of the photo-curable resin composition, curing uniformity may be reduced. Thus, an amount of the photo-polymerization initiator may be from about 0.01% to about 10% by weight based on the total weight of the photo-curable resin composition, and may be from about 1% to about 5% by weight based on the total weight of the photo-curable resin composition.

The photo-curable resin composition may include an additive such as a polymerization inhibitor, an antifoaming agent, and/or a releasing agent, as desired.

The polymerization inhibitor may inhibit viscosity variation of the photo-curable resin composition, and may increase preservation of viscosity uniformity. An antifoaming agent may reduce or prevent a generation of foam in the photo-curable resin composition. The releasing agent may increase ease of separation of a mold when the photo-curable resin composition is used for an imprinting process.

The photo-curable resin composition may include a coupling agent, an antioxidizing agent, a pigment, a dye, and/or a dispersing agent and may include the polymerization inhibitor, the antifoaming agent and the releasing agent, as desired.

The additives may be those known and used for a conventional photo-curable resin composition for an imprinting method.

The photo-curable resin composition may be cured by light. Examples of light for curing the photo-curable resin composition may include UV light, IR light, visible light, radiation, and laser light.

The photo-curable resin composition may be coated on various substrates. Examples of the substrates may include quartz, glass, metal oxide, metal, paper, and a plastic substrate such as a polyester film, a polycarbonate film or a polyimide film, a TFT array substrate, silicon oxide, silicon nitride, amorphous silicon, and polycrystalline silicon.

The photo-curable resin composition may be coated on the substrates through various methods. For example, the photo-curable resin composition may be coated through a dip coating method, an air knife coating method, a curtain coating method, a wire bar coating method, a gravure coating method, an extrusion coating method, a spin coating method, a slit scanning method, or an inkjet coating method.

The photo-curable resin composition may be used in various fields that may use a photo-curable resin. For example, the photo-curable resin composition may be used for forming an insulation layer of an electronic device, a partition, a mask of a photolithography process, or a mask of an imprinting process.

The photo-curable resin composition may form a mask pattern having increased etch-resistance. Thus, when a layer under the mask pattern is etched, a profile of the mask pattern may be maintained. Thus, profile consistency of a pattern formed from the layer may be increased.

Method for Forming a Fine Pattern

FIG. 1 to 6 are cross-sectional views illustrating a method for forming a fine pattern according to an exemplary embodiment of the present inventive concept. In an exemplary embodiment of the present inventive concept, a wire grid polarizer may be manufactured.

Referring to FIG. 1, a metal layer 12 may be formed on a base substrate 10. The metal layer 12 may be formed on the base substrate 10, and a protective layer 14 may be formed on the metal layer 14. A photo-curable resin composition may be formed on the protective layer 14 to form a coating layer 16.

The metal layer 12 may include aluminum, gold, silver, copper, chrome, iron, nickel, titanium, molybdenum, tungsten or an alloy thereof. A metal may be deposited on the base substrate 10 through a sputtering process or the like to form the metal layer 12. For example, a thickness of the metal layer 12 may be from about 80 nm to about 300 nm.

The protective layer 14 may prevent a profile of the metal layer 12 from changing in the process of etching the metal layer 12. For example, the protective layer 14 may include silicon oxide, silicon nitride, or silicon oxycarbide. A thickness of the protective layer 14 may be from about 10 nm to about 100 nm.

The photo-curable resin composition may include the radical reactive monomer, the nano-particle surface-modified with the organic compound and the photo-polymerization initiator. The photo-curable resin composition may include the additive such as the polymerization inhibitor, the antifoaming agent, and/or the releasing agent. For example, the photo-curable resin composition may include from about 0.01% to about 10% by weight of the nano-particle surface-modified with the organic compound, from about 0.01% to about 10% by weight of the photo-polymerization initiator, and a remainder of the radical reactive monomer. The photo-curable resin composition may include from about 0.01% to about 10% by weight of the additive.

The nano-particle surface-modified with the organic compound may include the particle core. The organic compound may be combined with the surface of the particle core. The particle core may include carbon, metal, the metal oxide or the fluorescent semiconductor. The organic compound may include the acryloyl group, the methacryloyl group, or the epoxy group. For example, the organic compound may include an acryloyl group.

The photo-curable resin composition may be substantially the same as the photo-curable resin composition according to exemplary embodiments of the present invention. Thus, duplicative descriptions may be omitted.

A mold 18 having a wire grid array shape may be disposed on the coating layer 16. The mold 18 may be pressed into the coating layer 16 to transfer the wire grid array shape to the coating layer 16.

For example, the mold 18 may include a plurality of protrusions 19 that extend in a first direction and may be spaced apart from each other in a second direction perpendicular to the first direction. The protrusions 19 may be spaced apart from each other by a predetermined distance.

The mold 18 may include an inorganic material such as silicon, silicon oxide, or quartz glass. The mold 18 may include a thermosetting resin, a thermoplastic resin, or a photo-curable resin. For example, the mold 18 may be formed from a polyimide resin, an epoxy resin, a polyurethane resin, a polypropylene resin, a polyethylene resin, a polyethylene terephthalate resin, or a polymethylmethacrylate resin.

The mold 18 may be transparent. For example, the mold 18 may have a relatively high UV light transmittance. The mold 18 may include a releasing layer that is in contact with the coating layer 16 so that the mold 18 may be separated from the coating layer 16 after the mold 18 is pressed. The releasing layer may include a compound including a fluoroalkyl group.

In another exemplary embodiment of the present inventive concept, the protective layer 14 may be omitted. Thus, the coating layer 16 may be formed directly on the metal layer 16.

Figure 2:
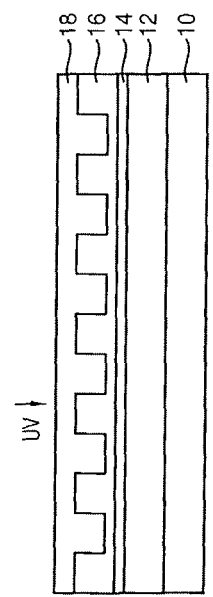

Referring to FIG. 2, while the mold 18 is pressed into the coating layer 16, light, for example, UV light may be radiated to the coating layer 16 to cure the coating layer 16. The coating layer 16 may be deformed by the mold 18 to form a cured pattern 17 (see, e.g., FIG. 3) including a plurality of protrusions. The plurality of protrusions may form a wire grid array pattern.

Figure 3:
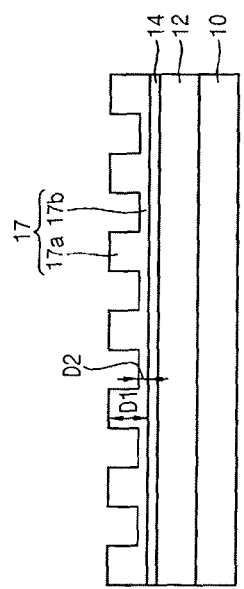

Referring to FIG. 3, the mold 18 may be removed from the cured pattern 17. The cured pattern 17 may include the plurality of protrusions and a remaining portion disposed between the protrusions. For example, the cured pattern 17 may include a first portion 17a having a first thickness D1, and a second portion 17b having a second thickness D2 less than the first thickness D1.

Figure 4:
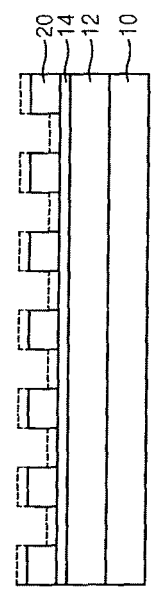

Referring to FIG. 4, the second portion 17b of the cured pattern 17 may be removed. For example, a dry-etching process may be performed to apply plasma to the cured pattern 17. As a result, the second portion 17b of the cured pattern 17 may be removed so that an upper surface of the protective layer 14 is exposed. A remaining portion of the first portion 17a may form a mask pattern 20 partially covering the protecting layer 14.

After the mask pattern 20 is formed, an optical examination may be performed to detect a defect of the mask pattern 20. The optical examination may measure a reflection intensity distribution with a fluorescent microscope. For the optical examination, the nano-particle surface-modified with the organic compound may include the fluorescent semiconductor such as cadmium selenide (CdSe), cadmium telluride (CdTe), zinc sulfide (ZnS), zinc selenide (ZnSe), cadmium sulfide (CdS), lead selenide (PbSe), or lead sulfide (PbS).

Figure 5:
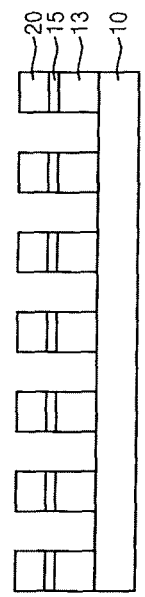
Figure 6:
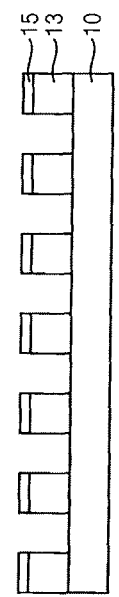

Referring to FIGS. 5 and 6, the metal layer 12 and the protective layer 14 may be etched by using the mask pattern 16 to form a metal pattern 13 and a protective pattern 15. Then, the mask pattern 20 may be removed. For example, a dry-etching process using plasma may be performed to etch the metal layer 12 and the protective layer 14.

The metal pattern 13 may extend in a direction to have a linear shape like the protrusion 19 of the mold 18. Adjacent metal patterns 12 may be spaced apart from each other by a predetermined distance. The metal patterns 13 may form a wire grid array that transmits a portion of an incident light and reflects another portion of the incident light depending on a polarizing element of the incident light.

The metal pattern 13 may have a pitch, thickness and width for performing polarization, as desired. The pitch may be defined as a sum of the widths of the metal patterns 13 and a distance between adjacent metal patterns 13.

For example, the pitch of the metal patterns 13 may be less than a wavelength of incident light. For example, the pitch may be equal to or less than about 400 nm for polarization of visible light. The pitch of the metal pattern 13 may be equal to or less than about 150 nm. For example, the pitch of the metal pattern 13 may be from about 50 nm to about 150 nm.

In an exemplary embodiment of the present inventive concept, the thickness of the metal pattern 13 may be equal to or more than about 80 nm, and may be from about 80 nm to about 300 nm.

A transmittance or a refractivity of the wire grid array may be determined by a ratio of the width to the pitch. The width of the metal pattern 13 may be equal to or less than about 100 nm. For example, the width of the metal pattern 13 may be from about 20 nm to about 100 nm.

The protective layer 15 may be formed on the metal pattern 13 to protect the metal pattern 13 and flatten a surface of a polarizer.

According to an exemplary embodiment of the present inventive concept, a mask pattern having an increased etch-resistance may be formed from the photo-curable resin composition including the nano-particle surface-modified with an organic compound according to exemplary embodiments of the present inventive concept. Thus, a profile of the mask pattern may be stably maintained in the process of etching a metal layer disposed under the mask pattern. Thus, the profile of the metal pattern formed from the metal layer may be protected and stably maintained.

When the nano-particle includes the fluorescent semiconductor, an etch-resistance of the mask pattern may be increased, and defect-detection of the mask pattern may be more readily detected.

While the protective layer may be formed on the metal layer to protect the profile of the metal pattern in an exemplary embodiment of the present inventive concept, the protective layer may be omitted in another exemplary embodiment of the present inventive concept. According to an exemplary embodiment of the present inventive concept, an etch-resistance of the mask pattern may be increased. Thus, the profile of the metal pattern may be stable even without the protective layer.

Example 1

A photo-curable resin composition including about 90% by weight of ethyleneglycole diacrylate as a radical-reactive monomer, about 2% by weight of 2-hydroxy-2-cycohexyl acetophenone as a photo-polymerization initiator, and about 8% by weight of $SiO_2$ nano-particles surface-modified with an acryloyl group and having a diameter of about 5 nm was prepared.

Example 2

A photo-curable resin composition including about 90% by weight of ethyleneglycole diacrylate as a radical-reactive monomer, about 2% by weight of 2-hydroxy-2-cycohexyl acetophenone as a photo-polymerization initiator, and about 8% by weight of ZnS nano-particles surface-modified with an acryloyl group and having a diameter of about 5 nm was prepared.

Comparative Example 1

A photo-curable resin composition including about 98% by weight of ethyleneglycole diacrylate as a radical-reactive monomer, and about 2% by weight of 2-hydroxy-2-cycohexyl acetophenone as a photo-polymerization initiator was prepared.

Comparative Example 2

A photo-curable resin composition including about 90% by weight of ethyleneglycole diacrylate as a radical-reactive monomer, about 2% by weight of 2-hydroxy-2-cycohexyl acetophenone as a photo-polymerization initiator, and about 8% by weight of $SiO_2$ nano-particles having a diameter of about 5 nm was prepared.

Comparative Example 3

A photo-curable resin composition including about 90% by weight of ethyleneglycole diacrylate as a radical-reactive monomer, about 2% by weight of 2-hydroxy-2-cycohexyl acetophenone as a photo-polymerization initiator, and about 8% by weight of ZnS nano-particles having a diameter of about 5 nm was prepared.

Exemplary Etch-Resistance Values

Exemplary etch-resistances of Examples according to exemplary embodiments of the present inventive concept and Comparative Examples are illustrated below. Each of the photo-curable resin compositions of Examples 1 and 2 and Comparative Examples 1 to 3 may be coated and cured to form patterns. An etch-ratio of each pattern is illustrated in Table 1. A dry-etching process using a gas mixture including Ar and $CF_4$ in a ratio of about 80:20 may be performed with a pressure of about 5 Pa. In Table 1, less etch-ratio may mean higher etch-resistance.

TABLE 1

| | Example 1 | Example 2 | Comparative Example 1 | Comparative Example 2 | Comparative Example 3 |
|---|---|---|---|---|---|
| Etch-ratio (nm/sec) | 1.9 | 1.8 | 4.4 | 3.9 | 3.7 |

Referring to Table 1, Examples 1 and 2 using the nano-particle surface-modified with the organic compound according to an exemplary embodiment of the present inventive concept may increase etch-resistance of the pattern formed therefrom compared to Comparative Examples 2 and 3 using a nano-particle that is not surface-modified with the organic compound.

Example 1 using SiO$_2$ nano-particles as well as Example 2 using ZnS nano-particles may have increased etch-resistance.

Exemplary embodiments of the present inventive concept may be used for forming an insulation layer of an electronic device, a partition, a mask of a photolithography process, or a mask of an imprinting process.

While the present inventive concept has been shown and described with reference to exemplary embodiments thereof, it will be apparent to those of ordinary skill in the art that various changes in form and detail may be made therein without departing from the spirit and scope of the inventive concept.

What is claimed is:

1. A photo-curable resin composition comprising:
    a nano-particle comprising an oxide layer, wherein the nano-particle is surface-modified with an organic compound, wherein the organic compound includes at least one of an acryloyl group, a methacryloyl group or an epoxy group, and wherein a carbon atom of the organic compound is chemically bonded to an oxygen atom of the oxide layer;
    a photo-polymerization initiator; and
    a radical-reactive monomer.

2. The photo-curable resin composition of claim 1, wherein the photo-polymerization initiator includes at least one of phenoxydichloro acetophenone, 4-t-butyl-dichloro acetophenone, 4-t-butyl-trichloro acetophenone, diethoxy acetophenone, 2-hydroxy-2-cyclohexyl acetophenone, 2-hydroxy-2-phenyl-1-phenyl propane-1-one, 1-(4-dodecylphenyl)-2-hydroxy-2-methyl propane-1-one, 1-(4-isopropylphenyl)-2-hydroxy-2-methyl propane-1-one, 4-(2-hydroxyethoxy)-phenyl-(2-hydroxy-2-propyl)ketone, 1-hydroxy-cyclohexylphenylketone, benzoin, benzoin methylethyl, benzoin isopropylethyl, benzoin isobutylethyl, bezophenone, benzoyl benzoic acid, benzoyl benzoic acid methyl, 4-phenylbenzophenone, hydroxyl benzophenone, acrylated benzophenone, 4-benzoyl-4'methyldiphenyldisulfide, 3,3'-dimethyl-4-methoxy benzophenone, 4,4'-dimethylamino benzophenone, 4,4'-diethylaminobenzophenone, 3,3',4,4'-tetra(t-butylperoxicarbonyl)benzophenone, thioxanthone, 2-chloro thioxanthone, 2-methyl thioxanthone, 2,4-dimethyl thioxanthone, 2,3-diethyl thioxanthone, 2,4-diisopropyl thioxanthone, isopropyl thioxanthone, 1-chloro-4-propyl thioxanthone, α-acyloxime ester, methylphenyl glyoxylate, 9,10-phenanthrenequinone, camphorquinone, dibenzosuberone, 2-ethylanthraquinone, 4',4''-diethylisophthalphenone, 2,2'-bis(2-chlorophenyl)-4,4',5,6'-tetraphenyl-1,2'-imidazole, 2,4,6-trimethylbenzoyldiphenyl phophine oxide, triphenylphosphonium hexafluoroantimonate, triphenylphosphonium hexafluorophosphate, 4-chlorophenyldiphenylsulfonium hexafluorophosphate or (2,4-cyclopentadiene-1-yl)[(1-methylethyl)benzene]-iron-hexafluorophosphate.

3. The photo-curable resin composition of claim 1, wherein the radical-reactive monomer includes at least one of acrylamide, (meth)acryloyl morpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethyleneglycol (meth)acrylate, t-octyl (meth)acrylamide, diacetone (meth)acrylamide, dimethylaminoethyl (meth)acrylate, ethylene glycol di(meth)acrylate, dicyclopentenyl (meth)acrylate, triethyleneglycol diacrylate, tetraethyleneglycol di(meth)acrylate or tricyclodecane diyldimethylene di(meth)acrylate.

4. The photo-curable resin composition of claim 1, wherein the photo-curable resin composition comprises from about 0.01% to about 10% by weight of the nano-particle, from about 0.01% to about 10% by weight of the photo-polymerization initiator, and wherein a remainder of the photo-curable resin composition comprises the radical-reactive monomer.

5. The photo-curable resin composition of claim 4, wherein the nano-particle includes a particle core including at least one of a carbon, a silicon oxide, a metal, a metal oxide or a fluorescent semiconductor.

6. The photo-curable resin composition of claim 5, wherein the metal includes at least one of gold, silver or aluminum.

7. The photo-curable resin composition of claim 5, wherein the metal oxide includes at least one of aluminum oxide ($Al_2O_3$), copper oxide (CuO) or titanium oxide ($TiO_2$).

8. The photo-curable resin composition of claim 5, wherein the fluorescent semiconductor includes at least one of cadmium selenide (CdSe), cadmium telluride (CdTe), zinc sulfide (ZnS), zinc selenide (ZnSe), cadmium sulfide (CdS), lead selenide (PbSe) or lead sulfide (PbS).

9. The photo-curable resin composition of claim 5, wherein a diameter of the nano-particle is equal to or less than about 10 nm.

10. A method for forming a fine pattern, the method comprising:
    forming a metal layer on a base substrate;
    depositing a photo-curable resin composition on the metal layer to form a coating layer, wherein the photo-curable resin composition includes a nano-particle surface-modified with an organic compound, a photo-polymerization initiator and a radical-reactive monomer, wherein the nano-particle comprises an oxide layer, wherein the organic compound includes at least one of an acryloyl group, a methacryloyl group or an epoxy group, and wherein a carbon atom of the organic compound is chemically bonded to an oxygen atom of the oxide layer;
    patterning the coating layer to form a mask pattern partially covering the metal layer; and
    etching the metal layer by using the mask pattern as an etch-stop layer.

11. The method of claim 10, wherein the metal layer includes at least one of aluminum, gold, silver, copper, chrome, iron, nickel, titanium, molybdenum, tungsten or an alloy thereof.

12. The method of claim 10, further comprising forming a protective layer including silicon oxide, silicon nitride or silicon oxycarbide on the metal layer, wherein the coating layer is formed on the protective layer.

13. The method of claim 10, wherein patterning the coating layer includes:
    pressing the coating layer with a mold;
    providing light to the coating layer to cure the coating layer;
    removing the mold; and
    etching the cured coating layer to form the mask pattern.

14. The method of claim 13, wherein the metal layer is etched through a dry-etching process using plasma.

15. The method of claim 10, wherein the photo-curable resin composition includes from about 0.01% to about 10% by weight of the nano-particle, from about 0.01% to about 10% by weight of the photo-polymerization initiator, and wherein a remainder of the photo-curable resin composition comprises the radical-reactive monomer.

16. The method of claim 15, wherein the nano-particle includes a particle core including at least one of a carbon, a silicon oxide, a metal, a metal oxide or a fluorescent semiconductor.

17. The method of claim 15, further comprising measuring a reflection intensity distribution of the mask pattern for detecting a defect of the mask pattern, wherein the nano-particle includes a fluorescent semiconductor.

* * * * *